United States Patent [19]
Gallarelli et al.

[11] Patent Number: 5,595,316
[45] Date of Patent: Jan. 21, 1997

[54] EQUIPMENT ENCLOSURE

[75] Inventors: Pat Gallarelli, Chapel Hill; Joel E. Walker; Robert E. Steinbugler, both of Raleigh, all of N.C.

[73] Assignee: International Business Machines Corporation, Armonk, N.Y.

[21] Appl. No.: 474,225

[22] Filed: Jun. 7, 1995

[51] Int. Cl.⁶ .................................................. B65D 6/16
[52] U.S. Cl. .......................... 220/4.33; 220/4.02; 220/3.7; 220/481
[58] Field of Search .................... 220/4.33, 4.02, 220/3.7, 4.03, 480, 481

[56] References Cited

U.S. PATENT DOCUMENTS

| | | |
|---|---|---|
| 3,413,050 | 11/1968 | Sommers et al. . |
| 3,724,702 | 4/1973 | Kay . |
| 4,102,554 | 7/1978 | Reimer . |
| 4,111,328 | 9/1978 | Eggert et al. . |
| 4,115,655 | 9/1978 | Prentice . |
| 4,300,016 | 11/1981 | Bergeron et al. . |
| 4,631,641 | 12/1986 | Brombal et al. . |
| 4,652,969 | 3/1987 | Stegenga . |
| 4,884,715 | 12/1989 | Pohlmann . |
| 4,938,351 | 7/1990 | Lewis . |
| 5,029,254 | 7/1991 | Stickney . |

FOREIGN PATENT DOCUMENTS 3005274  8/1981  Denmark .

*Primary Examiner*—Joseph M. Moy
*Attorney, Agent, or Firm*—Stephen T. Keohane; Kelly K. Kordzik

[57] ABSTRACT

An equipment enclosure insludes identical top and bottom portions each made from a single sheet of sheet metal, and a front panel and rack tube assembly wherein the front panel is made and stamped from a single sheet of sheet metal while the remaining tube assembly comprises the other three sides of the enclosure and is also produced from a single sheet of sheet metal. Left and right side plates may be fastened to the sides of the tube assembly to allow for various mounting configurations.

1 Claim, 5 Drawing Sheets

EQUIPMENT ENCLOSURE

TECHNICAL FIELD OF THE INVENTION

The present invention relates generally to the field of mechanical packaging, and in particular, to the field of equipment enclosures.

BACKGROUND OF THE INVENTION

Electrical chassis enclosures are utilized to enclose and protect printed circuit boards ("PCBs") and associated power supplies and electrical wiring. Such enclosures are either mounted in a rack (e.g., 19 inch rack), mounted within a wiring closet or allowed to stand freely on a desk or shelf, etc. The problem with such options is that different enclosures are required for each of these different requirements. As a result, a manufacturer or supplier of enclosures is required to maintain an inventory of different enclosures capable of fulfilling each requirement.

Another disadvantage of prior art equipment enclosures is that they utilize numerous pans that need to be disassembled for insertion of the electrical equipment, and then reassembled prior to mounting in the desired manner.

Yet another disadvantage of prior art equipment enclosures is that different tooling equipment is required to produce different sized enclosures, resulting in an increase in manufacturing costs. Often, different sizes of the same style of enclosure are desired.

As a result of the foregoing, there is a need in the art for a scalable equipment enclosure that is easy to manufacture with a minimal requirement of separate parts and tooling equipment. There is another need in the art for an equipment enclosures that is adaptable for rack mounting, wiring closet mounting, and free-standing mounting.

SUMMARY OF THE INVENTION

The present invention satisfies the foregoing needs by providing an equipment enclosure comprising identical top and bottom portions each made from a single sheet of sheet metal, a front panel and rack tube assembly wherein the front panel is made and stamped from a single sheet of sheet metal while the remaining tube assembly comprises the other three sides of the enclosure and is also produced from a single sheet of sheet metal. Left and right side plates may be fastened to the sides of the tube assembly to allow for various mounting configurations.

The side plates each have a flange portion, which when the plates are mounted in a first manner they allow for front rack mounting of the enclosure, which is utilized for wire closet mounting, and when attached to the enclosure in a second manner they allow for rear rack mounting of the enclosure, such as for computer room applications whee cabling from the rear is desired. The plates may also be mounted in a third manner that enables the enclosure to be implemented in a free-standing manner, such as on a table top.

An advantage of the present invention is that similarly styled equipment enclosures of different sizes can be easily manufactured minimizing additional manufacturing equipment to make the different sized enclosures.

Another advantage of the present invention is that the same top and bottom covers may be used for different sizes of the equipment enclosures.

Yet still another advantage of the present invention is that the enclosure may be made of a thinner gauge sheet metal since strength is added through the addition of the left and right side plates.

And, another advantage of the present invention is that each of the individual parts of the equipment enclosure when cut take on a basic rectangular shape such that they can be cut or stamped can be cut, stamped and tooled from single sheets of sheet metal with minimal material waste.

The foregoing has outlined rather broadly the features and technical advantages of the present invention in order that the detailed description of the invention that follows may be better understood. Additional features and advantages of the invention will be described hereinafter which form the subject of the claims of the invention.

DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
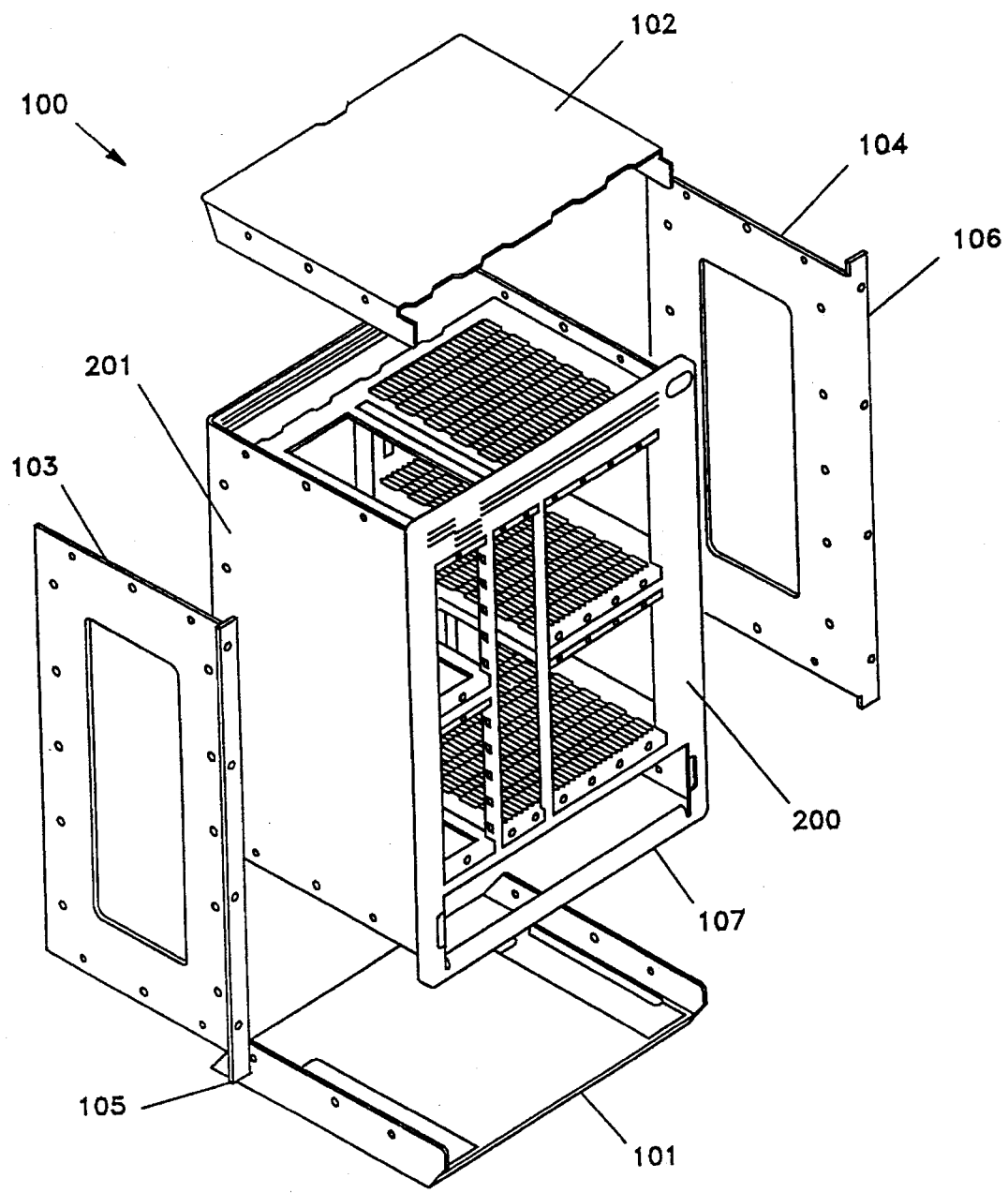
FIG. 1 illustrates an exploded isometric view of the enclosure of the present invention.

In the following description, numerous specific details are set forth to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

Referring to FIG. 1, there is illustrated an exploded isometric view of the present invention illustrating enclosure 100 for high-end hub-type products (large enclosures with pluggable modules). The design of enclosure 100 helps in minimizing costs by being a readily modifiable, scalable, and flexible enclosure for use on future products.

Enclosure 100 consists of identical top and bottom covers 102 and 101, respectively, front panel/rack/tube assembly 107 and side plates 103 and 104.

As will be described, enclosure 100 is adaptable for enclosing circuitry. Holes and slots 109 may be stamped on the front side of enclosure 100 to permit external access to such input/output means as gauges, LEDs, circuit boards, and switches coupled to enclosed circuitry. Furthermore, additional holes or slots (not shown) may be stamped in the rear of enclosure 100 to allow for passage of electrical wires, fiber optic cables, etc. for access to enclosed circuitry from the outside world. Moreover, holes or slots (not shown) may be stamped in cover 102 or base 101 for heat dissipation and ventilation.

A goal of the present invention is to provide an attractive enclosure for rack mount and table top installations in both wiring closets and computer room environments.

Enclosure 100 also provides a high degree of electromagnetic compatibility ("EMC") protection.

Enclosure 100, as will be described below, is also easy to manufacture since there are few parts to produce and fasten together.

To assemble enclosure 100, covers 101 and 102 are fastened to tube assembly 107 and side plates 103 and 104 are attached to the sides with screws (not shown). As can be seen, by the addition of side plates 103 and 104, and the fastening of the side plates substantially around the circumference of each side of the enclosure, the enclosure is well supported when enclosure 100 is mounted to an equipment rack by the fastening of flanges 105 and 106 to the rack. As will be further described below, flange portions 105 and 106 may be utilized for rack mounting of enclosure 100.

Figure 2A:
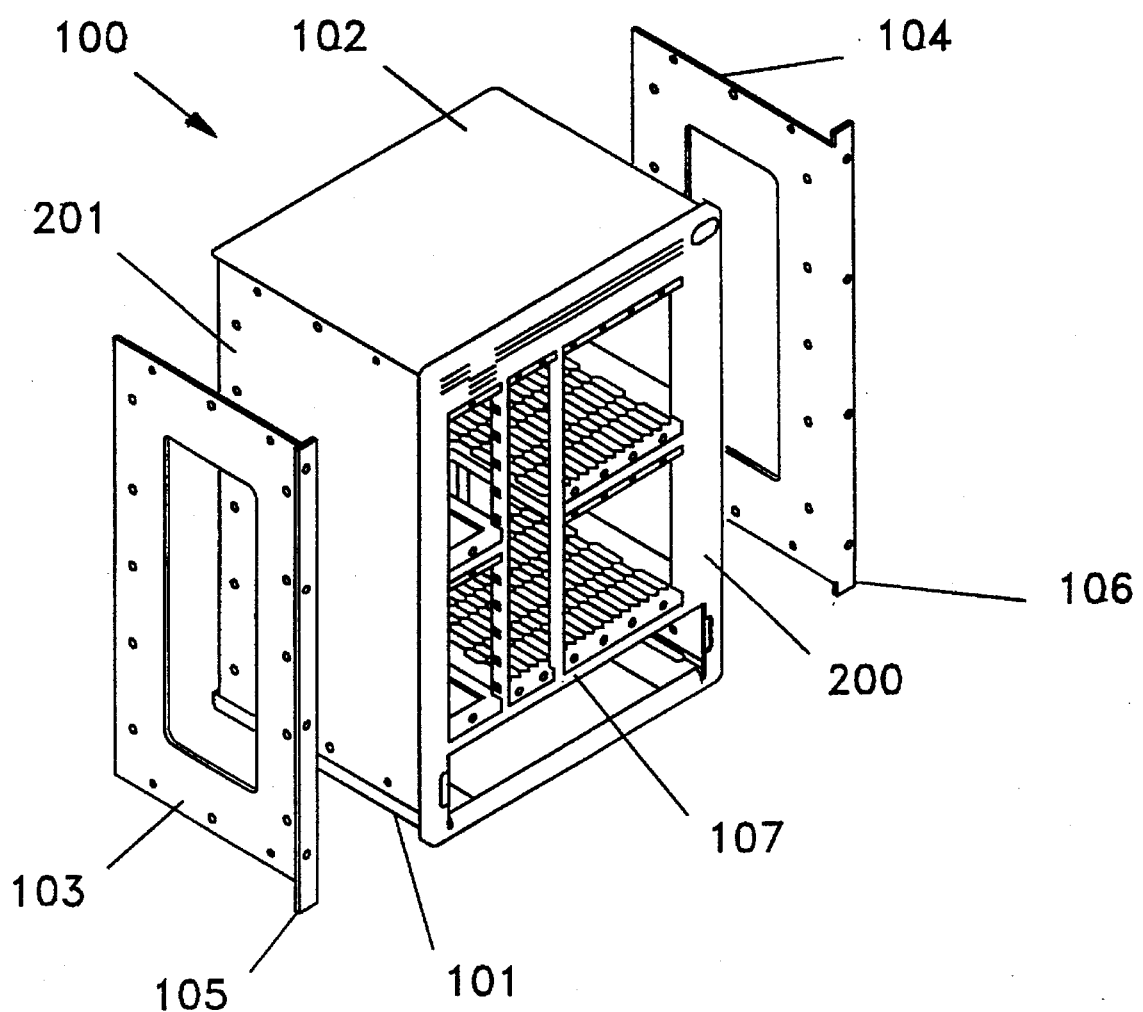
FIG. 2A illustrates the enclosure adaptable for rack mounting.

Referring next to FIG. 2A, enclosure 100 is illustrated in a manner showing how side plates 103 and 104 can be mounted to the sides of enclosure 100 so that flanges 105 and 106 project outwards from the front of enclosure 100 to allow for rack mounting of enclosure 100. Holes in flange portions 107 and 108 are positioned so that screws may be inserted therethrough and into matching threaded holes in a rack, such as a typical 19 inch rack (not shown).

Figure 2B:
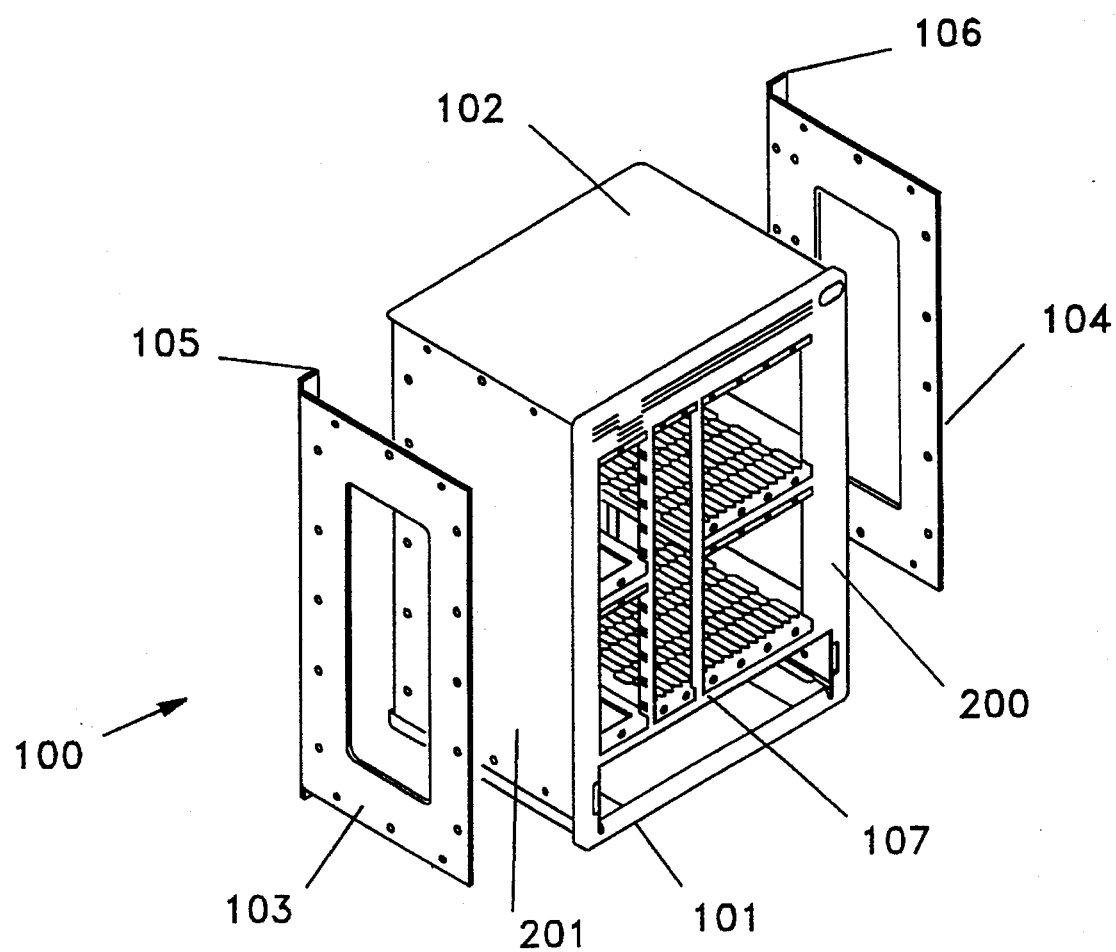
FIG. 2B illustrates the enclosure adaptable for table top mounting.

Referring next to FIG. 2B, enclosure 100 is illustrated in a manner showing how side plates 103 and 104 can be fastened to the sides of enclosure 100 so that flange portions 105 and 106 project inwards on the rear of enclosure 100, thus essentially removing flange portions 105 and 106 from projecting outwards from enclosure 100. In such an assembly, enclosure 100 can be utilized as a tabletop installation, without concern for protrusions of flange portions 105 and 106.

Though not illustrated herein, side plates 103 and 104 may also be mounted on enclosure 100 so that flanges 105 and 106 project outwards near the rear of enclosure 100.

Such an assembly provides for a reverse rack mount installation.

Enclosure 100 has a unique design of an offset flange tongue-in-slot cover-to-base attachment design allowing for the installation of optional grounding clips. The tongue in slot design provides excellent EMC protection. However, if further EMC grounding is required, provision for the addition of grounding clips is designed in. When used, the clips ground cover 102 and base 101 with a maximum 35 mm gap. The ground clips also secure the cover to the base prior to screw installation by creating a "snap" fit.

Figure 3:
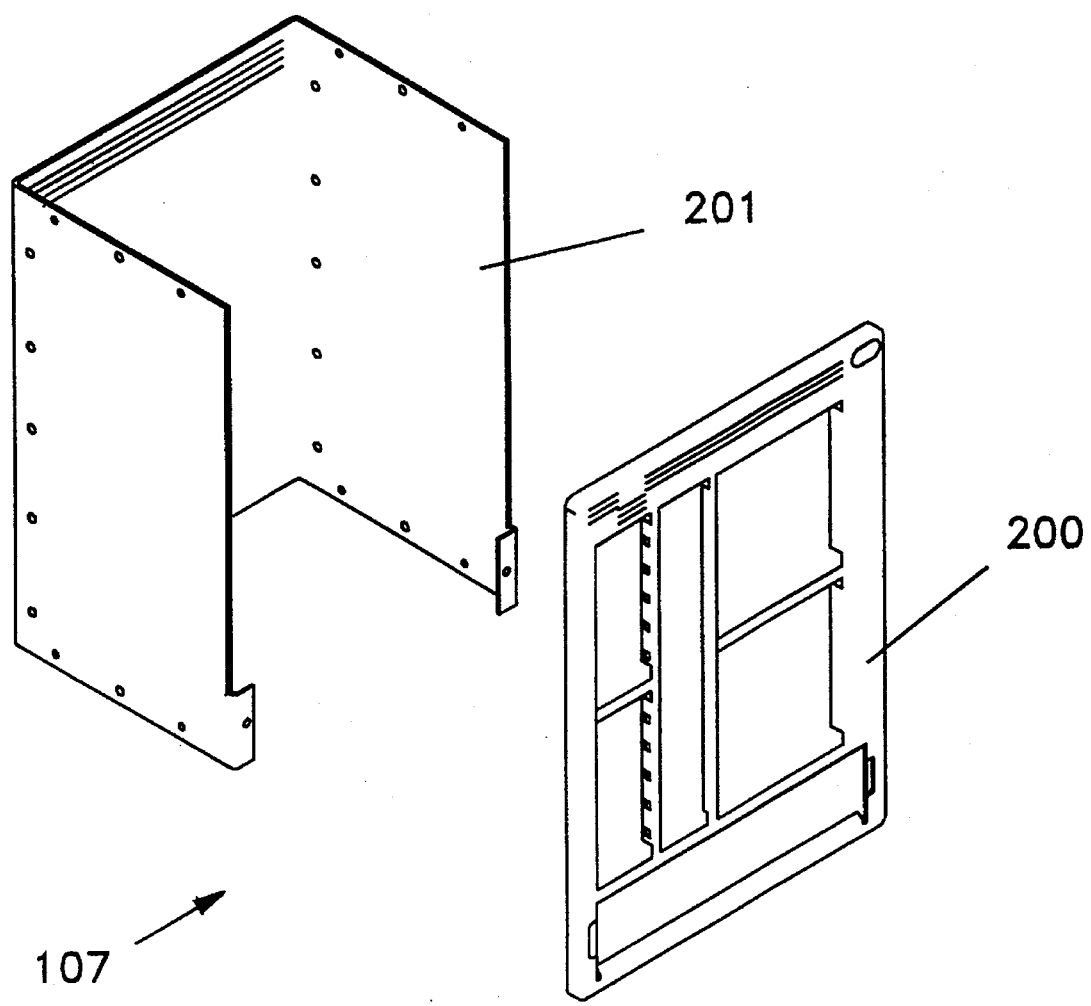
FIG. 3 illustrates the tube assembly of the enclosure.

Referring next to FIG. 3, there is illustrated tube assembly 107 with rear and side portions 201 and front panel 200. Different height and depth boxes can be produced because of the use of identical top and bottom covers 102 and 101. In other words, the tube assembly is scalable to any number of sizes for enclosure 100. To produce a different size enclosure 100, all that is needed is a different size piece of sheet metal, which is then bent into portion 201 utilizing the same manufacturing process for each size. In other words, using a typical brake press tooling device, different lengthed portions 201 can be easily manufactured by bending in the same manner the different sizes of sheet metal. Regardless of the height of portion 201, top and bottom covers 101 and 102 can be utilized for each size. Furthermore, front portion 200 is also folded and cut from one piece of sheet metal, and thus can be sized accordingly to the desired dimensions of enclosure 100. Likewise, side plates 103 and 104 may also be folded and cut from one piece of sheet metal and can thus be sized according to the dimensions of the desired enclosure 100.

Figure 4:
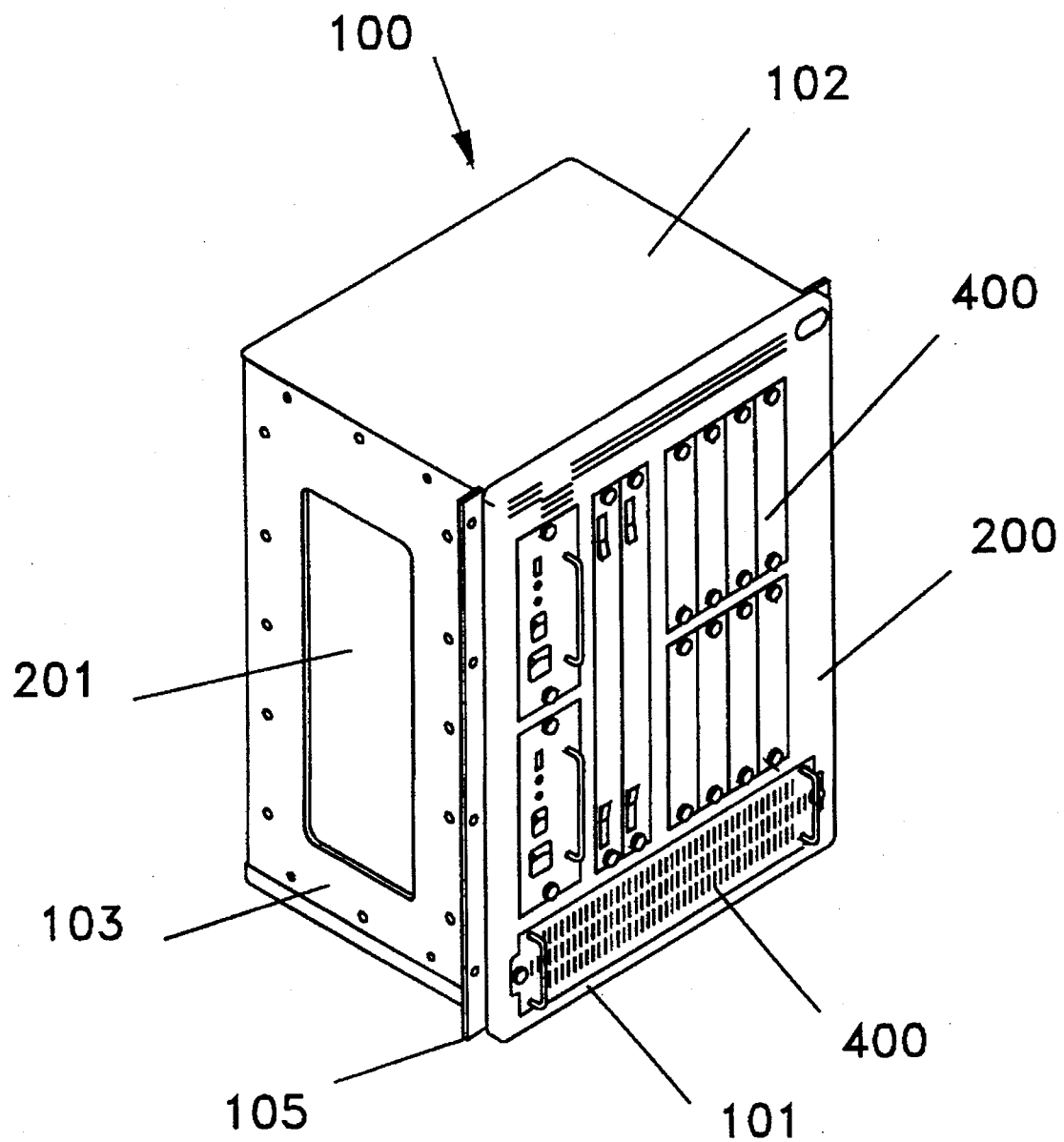
FIG. 4 illustrates an isometric view of the enclosure.

Referring next to FIG. 4, there is illustrated assembled enclosure 100 with components 400 inserted therein.

The unique side plate design provides strength to support the cantilevered enclosure allowing a thinner gauge sheet metal to be used for the rest of the enclosure (e.g., portion 201), reducing weight and material usage.

If enclosure 100 is painted with the covers and front panel/tube assembled, the unique design self-masks most paint-free areas critical for EMC protection.

Enclosure 100 also utilizes a unique fold tap design, which provides (1) an attractive corner dressing without any secondary conditioning such as welding and grinding, and (2) structural integrity to support the weight of the stand-alone box or any other boxes stacked on top.

Enclosure 100 is environmentally friendly since the design uses all sheet metal construction that requires no secondary plating operations prior to painting, uses one color paint that is water born, uses one color screened graphics, uses minimal plastic parts, uses a minimal number of labels, and provides better mechanical integrity to minimize foam shipping package cushioning. Enclosure 100 is also easily disassembled for reclamation. Furthermore, common enclosure geometry allows for the creation of a set of common shipping cartons and cushions.

Tube assembly 1007 is designed such that basically the same forming die set can be used to fold up tubes, panels and racks regardless of box height.

Top and bottom covers 102 and 101 are substantially identical thus virtually eliminating tooling costs and lowering piece price by economics of scale.

Side plates 103 and 104 are designed so that both (for a given height and depth) can be manufactured using the same die set (hard tooled blanking and forming).

The common enclosure provides additional and tangible cost savings:

Products using enclosure 100 can also use common power supplies, plug-in modules, fan tray, rubber feet, card mounting studs, AC/DC cables, fans, screws, etc.

Product Documentation—enclosure installation and use instructions are virtually the same for all products using enclosure 100, reducing the cost of producing product documentation.

Enclosure Manufacturing Process—use of the common enclosure minimizes the cost and time needed to set up enclosure manufacturing processes (tooling, paint, silk screen process are identical between products). Also, use of an existing enclosure size minimizes the time required for design pre-analysis by the sheet metal vendor, further reducing manufacturing cost/cycle time. A computer numerically controlled punch press can be used to produce different designs by implementing a simple programming change.

Box Assembly Process—common box footprint, components, and assembly process allows for creation of a flexible manufacturing line capable of producing all products using the enclosure.

Components/Materials Qualification—minimal additional development component/material qualifications are required for follow-on products.

Although the present invention and its advantages have been described in detail, it should be understood that various changes, substitutions and alterations can be made herein without departing from the spirit and scope of the invention as defined by the appended claims.

What is claimed is:

1. An enclosure comprising:

a continuous sheet metal top member;

a continuous sheet metal bottom member substantially identical to said top member;

a continuous sheet metal tube assembly;

a continuous sheet metal front panel having slots formed therein for permitting access to an inside of said enclosure;

means for attaching said front panel to said tube assembly;

means for attaching said top member to said tube assembly;

means for attaching said bottom member to said tube assembly;

first and second side plates having first and second flange portions, respectively, adaptable for coupling to an equipment rack;

means for attaching said first and second side plates to said enclosure so that said first and second flange portions project outward from a front of said enclosure for front facing mounting of said enclosure on said equipment rack;

means for attaching said first and second side plates to said enclosure so that said first and second flange portions project outward from a rear of said enclosure for rear facing mounting of said enclosure on said equipment rack; and means for attaching said first and second side plates to said enclosure so that said first and second flange portions project inward to a rear of said enclosure for stand-alone mounting of said enclosure.

* * * * *